(12) United States Patent
Huang et al.

(10) Patent No.: US 10,090,423 B2
(45) Date of Patent: Oct. 2, 2018

(54) POLYMER CONTAINING 1,2,5-BENZOSELENADIAZOLE-N-R1-5,6-DICARBOXYLIC ACID IMIDE AND PREPARATION METHOD AND USE THEREOF

(71) Applicant: SOUTH CHINA UNIVERSITY OF TECHNOLOGY, Guangdong (CN)

(72) Inventors: Fei Huang, Guangdong (CN); Xiaojuan Ma, Guangdong (CN); Peng Zhu, Guangdong (CN); Yong Cao, Guangdong (CN)

(73) Assignee: SOUTH CHINA UNIVERSITY OF TECHNOLOGY, Guangdong (CN)

( * ) Notice: Subject to any disclaimer, the term of this patent is extended or adjusted under 35 U.S.C. 154(b) by 0 days.

(21) Appl. No.: 15/545,321

(22) PCT Filed: Dec. 9, 2016

(86) PCT No.: PCT/CN2016/109097
§ 371 (c)(1),
(2) Date: Jul. 21, 2017

(87) PCT Pub. No.: WO2018/000735
PCT Pub. Date: Jan. 4, 2018

(65) Prior Publication Data
US 2018/0212074 A1      Jul. 26, 2018

(30) Foreign Application Priority Data
Jun. 28, 2016  (CN) .......................... 2016 1 0505761

(51) Int. Cl.
*C08G 59/00* (2006.01)
*H01L 31/0256* (2006.01)
*C08L 41/00* (2006.01)
*C08F 30/00* (2006.01)
*C08L 39/04* (2006.01)

(52) U.S. Cl.
CPC .......... *H01L 31/0256* (2013.01); *C08F 30/00* (2013.01); *C08L 39/04* (2013.01); *C08L 41/00* (2013.01); *C08L 2203/204* (2013.01); *H01L 2031/0344* (2013.01)

(58) Field of Classification Search
CPC ......... H01L 31/0256; H01L 2031/0344; C08L 41/00; C08L 39/04; C08L 2203/204; C08F 30/00
See application file for complete search history.

(56) References Cited

FOREIGN PATENT DOCUMENTS

| CN | 101550234 | 10/2009 |
| CN | 101712674 | 5/2010 |
| CN | 101775123 | 7/2010 |
| CN | 102718946 | 10/2012 |
| CN | 102746492 | 10/2012 |
| CN | 103732721 | 4/2014 |
| CN | 105968329 | 9/2016 |
| WO | 2010031479 | 3/2010 |

*Primary Examiner* — Shane Fang
(74) *Attorney, Agent, or Firm* — JCIPRNET

(57) ABSTRACT

The present invention discloses a polymer containing 1,2,5-benzoselenadiazole-N—$R_1$-5,6-dicarboxylic acid imide, and a preparation method and use thereof. The conjugated polymer prepared by the present invention has fluorescence, and a relatively wide absorption of sunlight, and thus it can be used for manufacture of an active layer for a polymer light-emitting diode device, a polymer field-effect transistor and a polymer solar cell.

9 Claims, 2 Drawing Sheets

POLYMER CONTAINING 1,2,5-BENZOSELENADIAZOLE-N-R1-5,6-DICARBOXYLIC ACID IMIDE AND PREPARATION METHOD AND USE THEREOF

CROSS-REFERENCE TO RELATED APPLICATION

This application is a 371 application of International PCT application serial no. PCT/CN2016/109097, filed on Dec. 9, 2016, which claims the priority benefit of Chinese application no. 201610505761.1, filed on Jun. 28, 2016. The entirety of each of the abovementioned patent applications is hereby incorporated by reference herein and made a part of this specification.

TECHNICAL FIELD

The present invention relates to the field of polymer applying to optoelectronic materials and devices, and specially, relates to a conjugated polymer containing 1,2,5-benzoselenadiazole-N—$R_1$-5,6-dicarboxylic acid imide, and a preparation method and use thereof.

BACKGROUND TECHNOLOGY

Solar energy is a kind of green renewable resources. There is a wide range of active layer materials of organic solar cells, with chemical structures of organic molecules being easy to modify and the preparation, purification and processing of the compound being simple, thus they can be made into flexible thin film devices with large area, having advantages of future costs as well as the widespread distribution of resources. The optical solar cell can be prepared into a film, and can be prepared and formed on a rollable and collapsible substrate, to form a flexible solar cell. The organic solar cell has advantages such as large manufacturing area, cheap, simple, and flexible, and thus has great commercial development and application prospects. However, at present, the development of organic solar conjugated molecular materials is not enough. In order to achieve an efficient photoelectric conversion, from the viewpoint of active layer materials, it is necessary for each active layer material to have efficient absorption of sunlight and high carrier mobility, and thus high conversion efficiency is achieved. To achieve these goals, developing more new donating polymers is of great importance.

SUMMARY OF THE INVENTION

The purpose of the present invention is to aim at the deficiencies of current development of new conjugated molecular material and provide a polymer material containing 1,2,5-benzoselenadiazole-N—$R_1$-5,6-dicarboxylic acid imide unit, which has a high energy conversion efficiency.

Another purpose of the present invention is to provide a preparation method and use of the conjugated polymer containing 1,2,5-benzoselenadiazole-N—$R_1$-5,6-dicarboxylic acid imide.

The present invention is achieved by following technical solution:

a conjugated polymer containing 1,2,5-benzoselenadiazole-N—$R_1$-5,6-dicarboxylic acid imide, with its structural formula being:

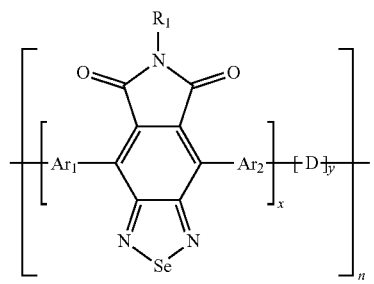

wherein $R_1$ is a hydrogen atom or an alkyl chain; the alkyl chain is a linear alkyl chain, a branched alkyl chain or a cyclic alkyl chain having 1 to 24 carbon atoms, or one or more of the carbon atoms are substituted by oxygen atom, alkenyl, alkynyl, aryl, hydroxy, amino, carbonyl, carboxyl, ester, cyano or nitro, and the hydrogen atom is substituted by halogen atom or functional groups as above; $Ar_1$ and $Ar_2$ are aromatic groups; D is an electron-donating unit; and n is a natural number from 1 to 10000, 0<x<1, 0<y<1, x+y=1. x and y are relative amounts of the 1,2,5-benzoselenadiazole-N—$R_1$-5,6-dicarboxylic acid imide unit and electron-donating unit D in the conjugated polymer, respectively. The electron-donating unit D and the 1,2,5-benzoselenadiazole-N—$R_1$-5,6-dicarboxylic acid imide are connected in a conjugate way. n is a degree of polymerization of the conjugated polymer.

Further, the aromatic groups $Ar_1$ and $Ar_2$ are one or more of following structures:

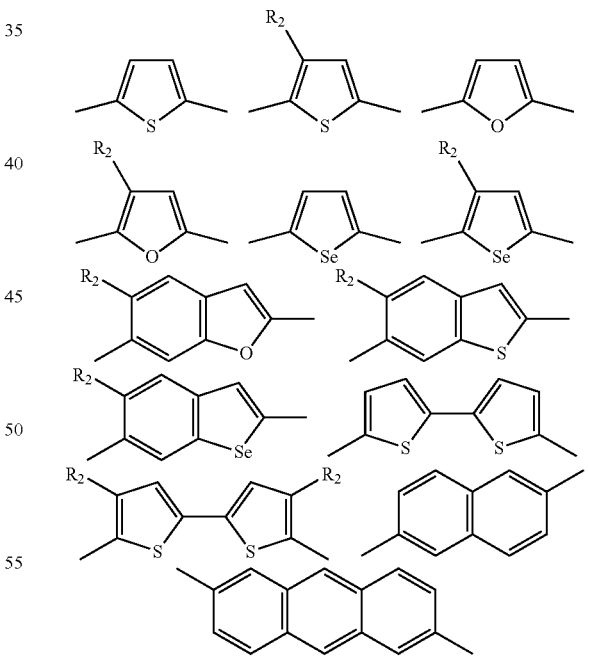

wherein $R_2$ is a hydrogen atom or an alkyl chain, or one or more of the carbon atoms are substituted by oxygen atom, alkenyl, alkynyl, aryl, hydroxy, amino, carbonyl, carboxyl, nitro, phenyl or thienyl, or one or more of the hydrogen atoms are substituted by halogen atom.

Further, the electron-donating unit D is one or more of structures shown below:

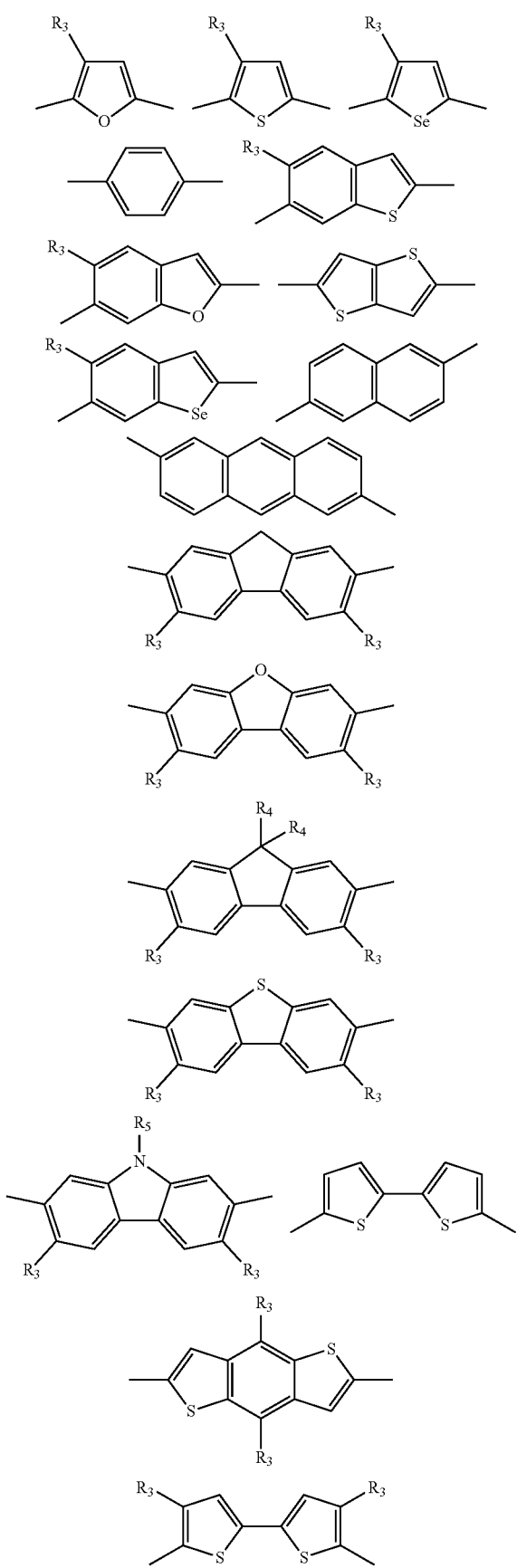
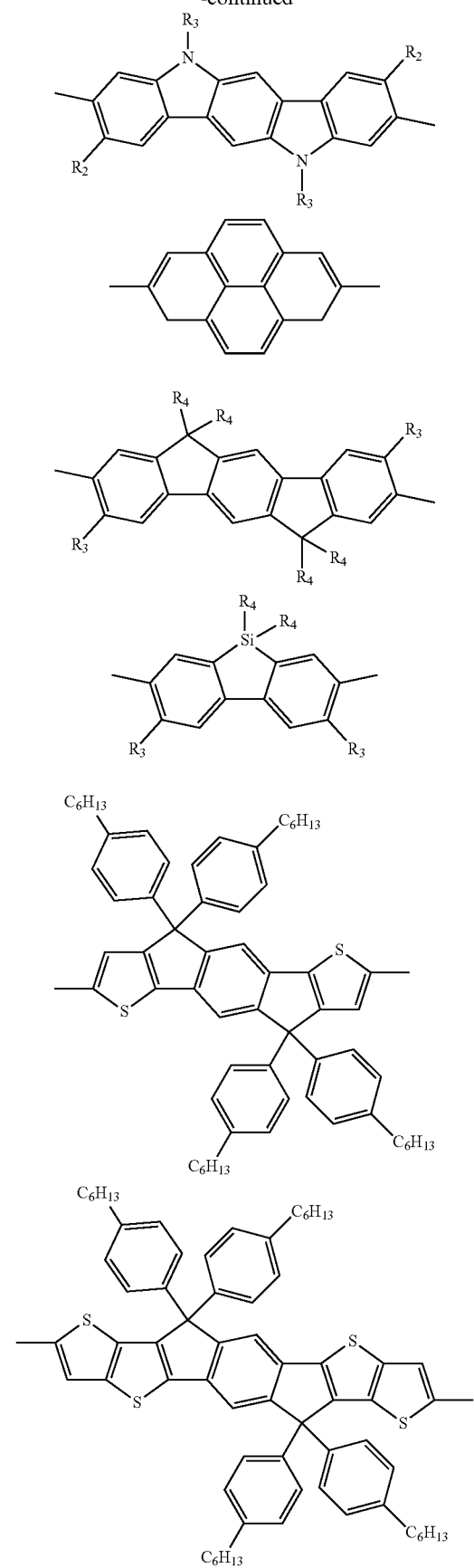

-continued

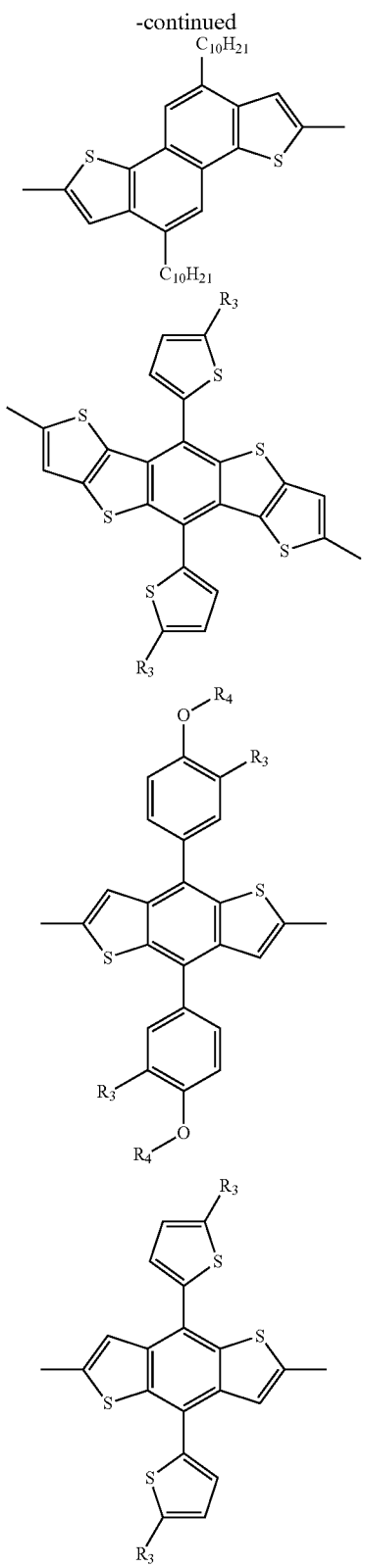

wherein $R_3$ and $R_4$ are hydrogen atoms or alkyl chains, or one or more of the carbon atoms are substituted by oxygen atom, alkenyl, alkynyl, aryl, hydroxy, amino, carbonyl, carboxyl, nitro, phenyl or thienyl, or one or more of the hydrogen atoms are substituted by halogen atom.

Furthermore, said $R_2$, said $R_3$ and said $R_4$ are linear alkyl chains, branched alkyl chains or cyclic alkyl chains having 1 to 30 carbon atoms.

The above-described conjugated polymers are used in preparation of a luminescent layer of a polymer light-emitting diode device, in preparation of a semiconductor active layer in a polymer field-effect transistor, or in preparation of an active layer of a polymer solar photovoltaic cell.

In the present invention, by selecting several conjugate electron-donating units for still coupling copolymerization with monomers containing 1,2,5-benzoselenadiazole-N—$R_1$-5,6-dicarboxylic acid imide, respectively, the conjugated polymer containing 1,2,5-benzoselenadiazole-N—$R_1$-5,6-dicarboxylic acid imide is obtained.

The conjugated polymer containing 1,2,5-benzoselenadiazole-N—$R_1$-5,6-dicarboxylic acid imide according to the present invention may be prepared by a method as follows:

(1) using 2,5-dithieno-3,4-thiazole as a parent for reacting with dimethyl acetylenedicarboxylate, 4,7-bis(thien-2-yl)benzo[c][1,2,5]thiadiazole-5,6-dimethyl isophthalate is obtained; by a hydrolyzation, 4,7-bis(thien-2-yl)benzo[c][1,2,5]thiadiazole-5,6-dicarboxylic acid is obtained; then reacting with acetic anhydride, 4,8-bis(thien-2-yl)isobenzofuran[5,6-C][1,2,5]thiadiazole-5,7-diketone is obtained; then reacting with octylamine, 6-octyl-4,8-bis(thien-2-yl)-5H-[1,2,5]thiadiazolo[3,4-f]isoindole-5,7(6H)-diketone is obtained; by a reduction with an iron powder, 5,6-diamino-4,7-bis(thien-2-yl)-N—$R_1$-isoindole-1,3-diketone is obtained, then reacting the 5,6-diamino-4,7-bis(thien-2-yl)-N—$R_1$-isoindole-1,3-diketone with selenium dioxide, 4,7-bis(thien-2-yl)-1,2,5-benzoselenadiazole-N—$R_1$-5,6-dicarboxylic acid imide is obtained, and finally, by a bromination with NBS, a final monomer of 4,7-bis(5-bromo-thien-2-yl)-1,2,5-benzoselenadiazole-N—$R_1$-5,6-dicarboxylic acid imide is obtained.

(2) metal-catalyzed cross-coupling reaction: reacting a monomer containing the electron-donating unit D and having an active functional group for the metal-catalyzed cross-coupling reaction with the 4,7-bis(5-bromo-thien-2-yl)-1,2,5-benzoselenadiazole-N—$R_1$-5,6-dicarboxylic acid imide obtained in step (1) in the presence of a metal catalyst, a conjugated polymer of a preliminary functional structure containing the electron-donating unit and the 4,7-bis(thien-2-yl)-1,2,5-benzoselenadiazole-N—$R_1$-5,6-dicarboxylic acid imide is obtained.

(3) in step (2), by an adjustment and an transformation of the structure of D, a derivative of the 4,7-bis(thien-2-yl)-1,2,5-benzoselenadiazole-N—$R_1$-5,6-dicarboxylic acid imide may have good solution processability and photoelectric properties; finally, the structure of 4,7-bis(thien-2-yl)-1,2,5-benzoselenadiazole-N—$R_1$-5,6-dicarboxylic acid imide is successfully introduced into the polymer, and a series of conjugated polymers containing 4,7-bis(thien-2-yl)-1,2,5-benzoselenadiazole-N—$R_1$-5,6-dicarboxylic acid imide is prepared.

Structures of small molecules and the polymer material are characterized by nuclear magnetic resonance (NMR), mass spectrum (MS) and gel permeation chromatography (GPC). Spectroscopic properties of the polymer material are tested by an ultraviolet-visible spectrometer. At the same time, the prepared polymers are prepared into an optoelectronic device to characterize their photoelectric properties.

In the 1,2,5-benzoselenadiazole-N—$R_1$-5,6-dicarboxylic acid imide of the present invention, the selenium atom has a big volume and many electrons, so that the polymer containing the selenium atom is prone to red-shift in an absorption spectrum. It is expected to show a better narrowband-gap solar cell material. It is predicted that the conjugated polymer containing 1,2,5-benzoselenadiazole-N—$R_1$-5,6-dicarboxylic acid imide has good optical properties and is a kind of material with commercial application prospect.

Structural formulas of 2,5-dithieno-3,4-thiazole and 1,2,5-benzoselenadiazole-N—$R_1$-5,6-dicarboxylic acid imide are as follows:

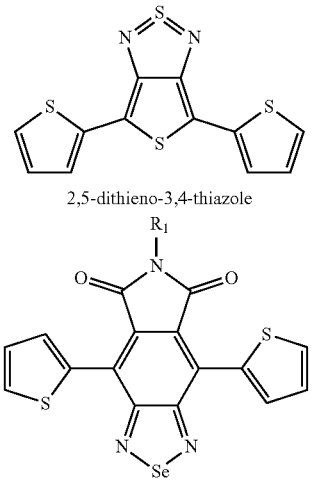

2,5-dithieno-3,4-thiazole 1,2,5-benzoselenadiazole-N-$R_1$-5,6-dicarboxylic acid imide The conjugated polymer material based on 1,2,5-benzoselenadiazole-N—$R_1$-5,6-dicarboxylic acid imide is a promising kind of optoelectronic material, and so far, has not been reported in this field. The present invention synthesized the conjugated polymer containing 1,2,5-benzoselenadiazole-N—$R_1$-5,6-dicarboxylic acid imide for the first time, and successfully applied it to the field of optoelectronics.

Compared with the prior arts, the present invention has following advantages:

The conjugated polymer containing 1,2,5-benzoselenadiazole-N—$R_1$-5,6-dicarboxylic acid imide has a novel structure, which has originality. The conjugated polymer containing 1,2,5-benzoselenadiazole-N—$R_1$-5,6-dicarboxylic acid imide has a variety of functions, and benzoselenadiazole compounds have very low optical band gap and good stability. The selenium atom has a larger atomic radius and many electrons, so that the polymer containing the selenium atom is prone to red-shift in an absorption spectrum. Because of its good solution processability and excellent photoelectric properties such as a relatively narrow band gap, it has a good application in the fields of production of a luminescent layer of a polymer light-emitting diode, and active layers of a polymer field-effect transistor and a polymer solar cell.

DETAILED DESCRIPTION OF THE EMBODIMENTS

Figure 1:
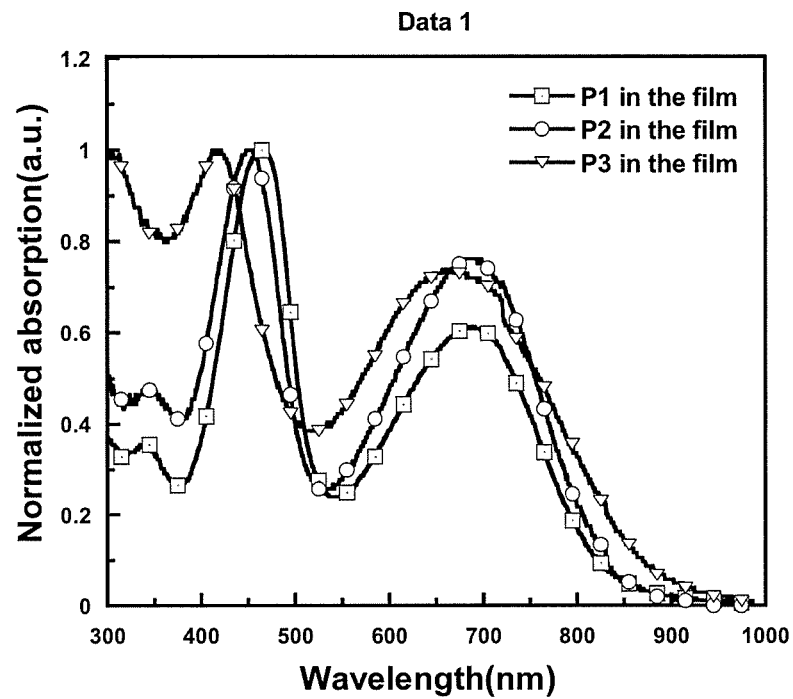
FIG. 1 is an absorption spectrum of a film made of the prepared polymer.

In order to understand the content of the present invention better, technical solutions of the present invention are further described below by means of specific embodiments, including synthesis, characterization, and device fabrication, but not limited hereto.

Embodiment 1

Preparation route and synthetic method of 4,7-bis(5-bromo-thien-2-yl)-1,2,5-benzothiadiazole-N—$R_1$-5,6-dicarboxylic acid imide.

(1) Preparation of 4,7-bis(thien-2-yl)benzo[c][1,2,5]thiadiazole-5,6-dimethyl isophthalate, with a synthetic route as follows:

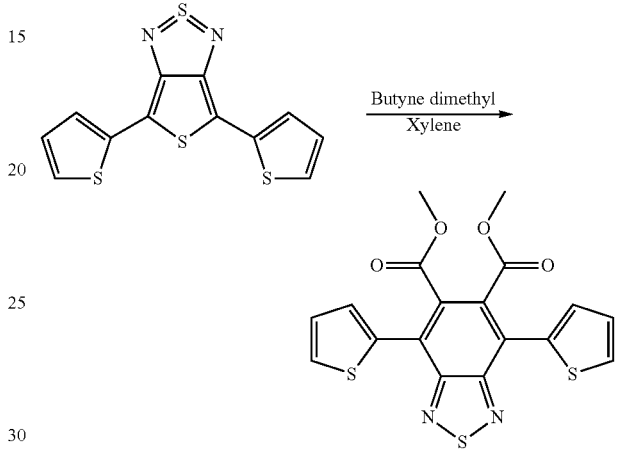

2,5-dithieno-3,4-thiazole (7.34 g, 23.99 mmol) and dimethyl acetylenedicarboxylate (6.81 g, 47.97 mmol) were added into a 250 mL three-necked flask under nitrogen, then 150 mL of xylene was added as a solvent, and then they were heated to 110° C. for reaction for 12 hours. Post-treatment: removing the xylene by rotary evaporation, adding DCM, mixing with silica gel powder, and then carrying out dry column-packing. Finally, 5.6 g of light yellow solid product was obtained. Yield: 59.01%.

(2) Preparation of 4,7-bis(thien-2-yl)benzo[c][1,2,5]thiadiazole-5,6-dicarboxylic acid, with a synthetic route and a synthetic method as follows:

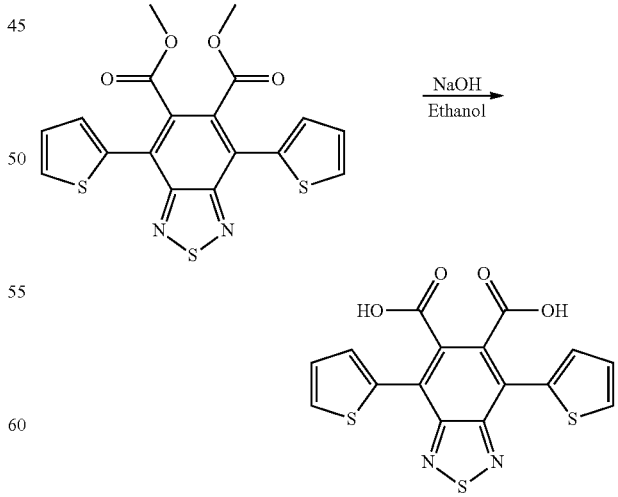

4,7-bis(thien-2-yl)benzo[c][1,2,5]thiadiazole-5,6-dimethyl isophthalate (5.6 g, 13.46 mmol) was added into a 250 mL three-necked flask under nitrogen, then 150 mL of absolute methanol was added, then NaOH solution (4.6 mol/L, 30 mL) was dropwise added, and then they were heated to 100° C. for reaction for 12 hours. Post-treatment: adding aqueous hydrochloric acid solution into the reaction mixture, stirring for several hours, and then filtering. 4.46 g of yellow solid was obtained, with a yield: 85%.

(3) Preparation of 4,8-bis(thien-2-yl)isobenzofuran[5,6-C][1,2,5]thiadiazole-5,7-diketone, with a synthetic route and a synthetic method as follows:

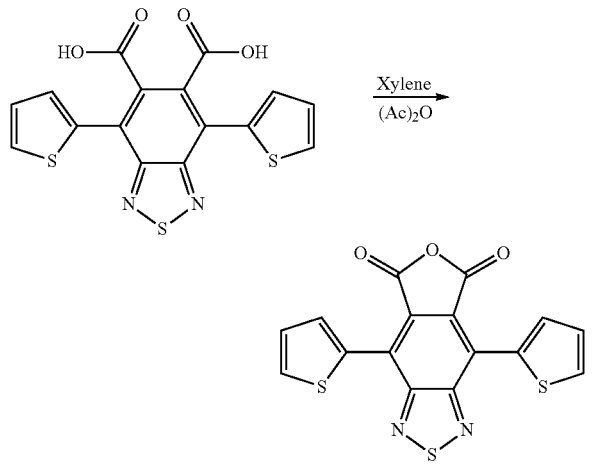

4,7-bis(thien-2-yl)benzo[c][1,2,5]thiadiazole-5,6-dicarboxylic acid (4.46 g, 11.49 mmol) and 33.92 g of acetic anhydride were added into a 250 mL three-necked flask under nitrogen, then 160 mL of xylene was added as a solvent, and then they were heated to 110° C. for reaction for 12 hours. Post-treatment: after rotary evaporation, adding absolute ethanol and then filtering. 3.78 g of yellow solid product was obtained. Yield: 88%.

(4) Preparation of 6-octyl-4,8-bis(thien-2-yl)-5H-[1,2,5]thiadiazolo[3,4-f]isoindole-5,7(6H)-diketone, with a synthetic route and a synthetic method as follows:

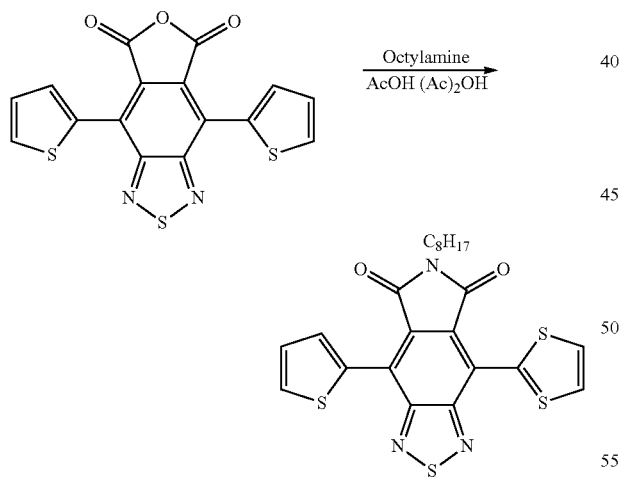

4,8-bis(thien-2-yl)isobenzofuran[5,6-C][1,2,5]thiadiazole-5,7-diketone (3.78 g, 10.22 mmol) and octylamine (2.64 g, 20.42 mmol) were added into a 500 mL three-necked flask under nitrogen, then acetic acid (180 mL) was added, then they were heated to 100° C. for reaction for 8 hours, then acetic anhydride (70 mL) was added by a syringe, and then the reaction was carried out at 100° C. for 6 hours. Post-treatment: after rotary evaporation, adding DCM for dissolution, then carrying out dry column-packing, and finally carrying out recrystallization. 3.97 g of yellow solid product was obtained. Yield: 78%.

(5) Preparation of 5,6-diamino-4,7-bis(thien-2-yl)-N-octyl-isoindole-1,3-diketone, with a synthetic route and a synthetic method as follows:

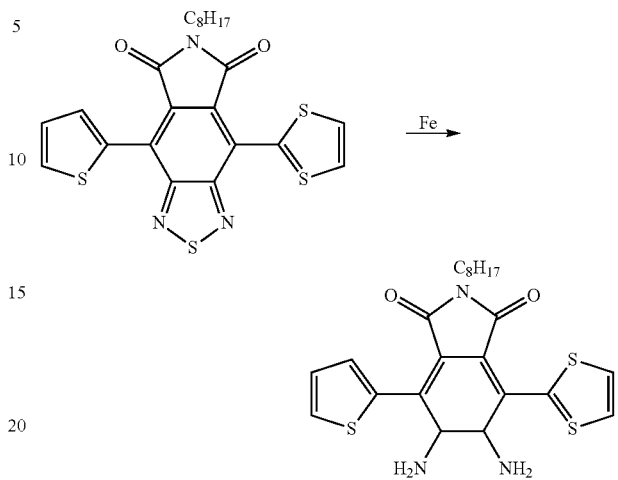

6-octyl-4,8-bis(thien-2-yl)-5H-[1,2,5]thiadiazolo[3,4-f]isoindole-5,7(6H)-diketone (3.97 g, 8.25 mmol) and iron powder (5.54 g, 98.92 mmol) were added into a 250 mL three-necked flask under nitrogen, and then 160 mL of acetic acid was added as a solvent. They were heated to 130° C. for reaction for 4 hours. Post-treatment: adding the reaction mixture into a beaker containing water, extracting iron scurf, then filtering, and carrying out dry column-packing after blow-dried. Finally, 3.17 g of yellow solid was obtained, with a yield: 85%.

(6) Preparation of 4,7-bis(thien-2-yl)-1,2,5-benzoselenadiazole-N-octyl-5,6-dicarboxylic acid imide, with a synthetic route and a synthetic method as follows:

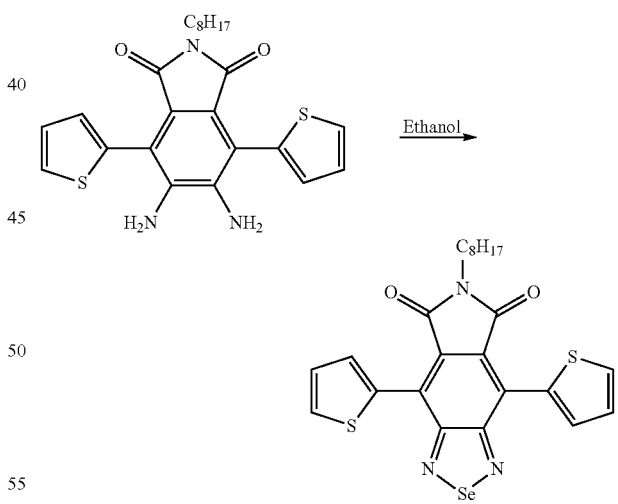

5,6-diamino-2-octyl-4,7-bis(thien-2-yl)isoindole-1,3-diketone (3.17 g, 7.00 mmol) was added into a 250 mL three-necked flask under nitrogen, 80 mL of ethanol was added as a solvent, then selenium dioxide (0.93 g, 8.40 mmol) was added, and then they were heated to 85° C. for reaction for 12 hours. Post-treatment: carrying out rotary evaporation and then recrystallization. Finally, 2.79 g of red solid product was obtained, with a yield: 83%.

(7) Preparation of 4,7-bis(5-bromo-thien-2-yl)-1,2,5-benzoselenadiazole-N-octyl-5,6-dicarboxylic acid imide, with a synthetic route and a synthetic method as follows:

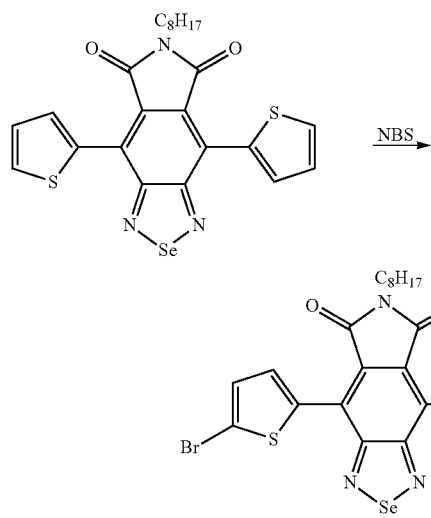

6-octyl-4,8-bis(thien-2-yl)-5H-[1,2,5]selenadiazolo[3,4-f]isoindole-5,7(6H)-diketone (2.79 g, 5.28 mmol) and NBS (2.16 g, 12.14 mmol) were added into a 150 mL three-necked flask under nitrogen, then 100 mL of chloroform was added as a solvent, and then the reaction was carried out at room temperature for 24 hours. Post-treatment: extracting DCM, and then carrying out dry column-packing. Finally, 2.68 g of red solid product was obtained. Yield: 76%. H-NMR: (CDCl$_3$) δ (ppm): 1H NMR (500 MHz, CDCl3) δ 7.68 (d, J=4.0 Hz, 2H), 7.21 (d, J=4.0 Hz, 2H), 3.78-3.65 (m, 2H), 1.77-1.60 (m, 2H), 1.29 (d, J=17.7, 8.6, 4.6 Hz, 12H), 0.86 (t, J=7.0 Hz, 4H). Mass spectrum: calculated value: 868.34; measured value: 868.01.

Embodiment 2

Preparation of poly-6octyl-4-(5-(4,4,9,9-tetra(4-methoxyphenyl)-4,9-dihydro-s-benzobiindeno[1,2-b:5,6-b']pyrid-2-yl)thien-2-yl)-8-(thien-2-yl)-5H-[1,2,5]selenadiazolo[3,4-f]isoindole-5,7(6H)-diketone, with a synthetic route and synthetic steps as follows:

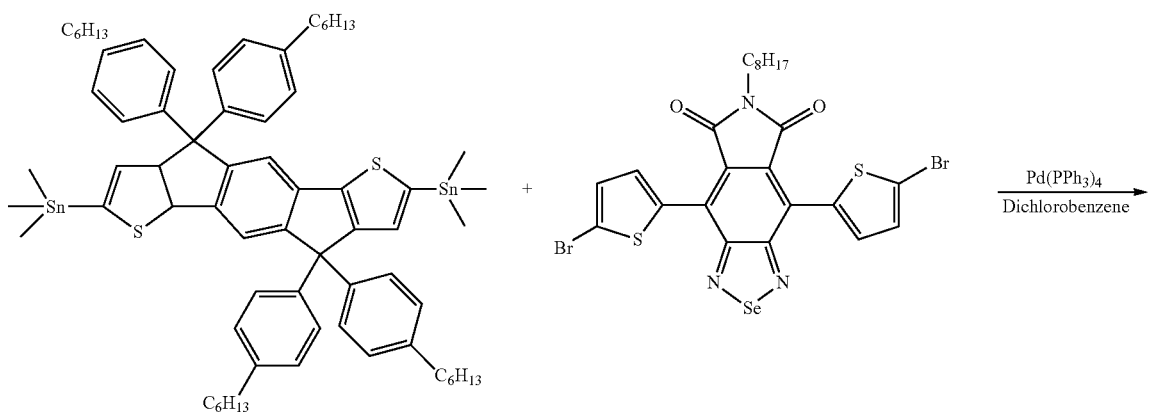

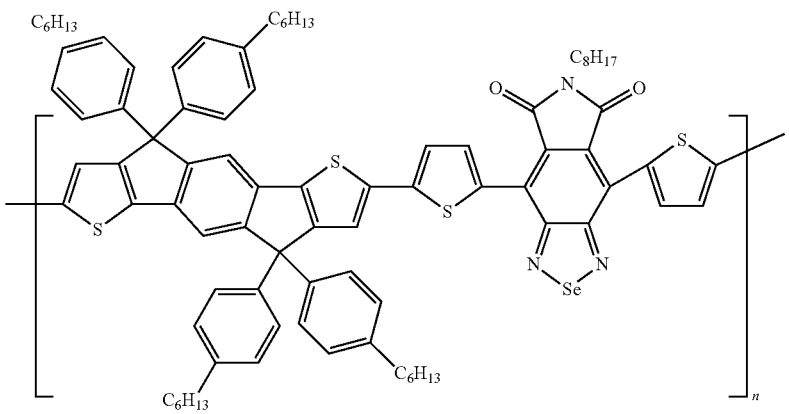

P1

4,7-bis(5-bromo-thien-2-yl)-1,2,5-benzoselenadiazole-N-octyl-5,6-dicarboxylic acid imide (103 mg, 0.15 mmol), (4,4,9,9-tetra(4-methoxyphenyl)-4,9-dihydro-s-benzobiindeno[1,2-B:5,6-b']di-2,7-diyl)bis(tri methylstannane) (185 mg, 0.15 mmol), tetra(triphenylphosphine)palladiumn (8 mg) and xylene (4 mL) were added into a 10 mL microwave tube under argon, and then the reaction was temperature, the reaction liquid was precipitated in methanol. Soxhlet extraction was carried out with methanol, acetone and n-hexane successively, then an aqueous solution of sodium diethyldithiocarbamate trihydrate (225 mg, 1 mmol, 100 mL water) was added, and a stirring was carried out at 60° C. for 8 hours. Palladium catalyst was removed from the reaction. Soxhlet extraction was carried out with methanol, acetone and n-hexane. After drying, a dark green solid (192 mg) was obtained, with a yield: 87.77%. H-NMR: (CDCl$_3$) δ (ppm): 1H NMR (500 MHz, CDCl3) δ 7.89 (d, J=3.5 Hz, 2H), 7.57 (d, J=9.8 Hz, 2H), 7.24 (s, 2H), 7.25 (d, J=8.1 Hz, 8H), 7.16 (d, J=8.5 Hz, 8H), 4.83 (t, 2H), 2.55 (p, J=17.0 Hz, 8H), 1.76-1.54 (m, 10H), 1.43-1.06 (m, 34H), 0.88 (dd, J=7.8, 5.6 Hz, 15H). Elemental analysis: calculated value: C, 73.71%; H, 6.68%; N, 2.93%; 0, 2.23%; S, 8.94%; Se, 5.51%; tested value: C, 73.78%; H, 6.60%; N, 2.93%; 0, 2.24%; S, 8.94%; Se, 5.51%. Mass spectrum: calculated value: 1461.99; measured value: 1461.07.

4,8-bis(5-bromothien-2-yl)-6-octyl-5H-[1,2,5]selenadiazolo[3,4-f]isoindole-5,7(6H)-diketone (103 mg, 0.15 mmol), IDTT (207 mg, 0.15 mmol), tetra(triphenylphosphine)palladium (8 mg) and xylene (4 mL) were added into a 10 mL microwave tube under argon, and then the reaction was carried out by microwave at 200° C. for 45 minutes. After the reaction was cooled to room temperature, the reaction liquid was precipitated in methanol. Soxhlet extraction was carried out with methanol, acetone and n-hexane successively, then an aqueous solution of sodium diethyldithiocarbamate trihydrate (225 mg, 1 mmol, 100 mL water) was added, and a stirring was carried out at 60° C. for 8 hours. Palladium catalyst was removed from the reaction. Soxhlet extraction was carried out with methanol, acetone and n-hexane. After drying, a dark green solid (202 mg) was obtained, with a yield: 87.45%. H-NMR: (CDCl$_3$) δ (ppm): 1H NMR (500 MHz, CDCl3) δ 7.91 (d, J=3.5 Hz, 2H), 7.77 (t, 2H), 7.53 (d, J=9.8 Hz, 2H), 7.29 (s, 2H), 7.21 (d, J=8.1 Hz, 8H), 7.12 (d, J=8.5 Hz, 8H), 4.80 (t, 2H), 2.58 (p, J=17.0 Hz, 8H), 1.79-1.58 (m, 10H), 1.47-1.13 (m, 34H), 0.87 (dd, J=7.8, 5.6 Hz, 15H). Elemental analysis: calculated value: C, 71.47%; H, 6.19%; N, 2.72%; 0, 2.07%; S, 12.44%; Se, 5.11%; tested value: C, 71.41%; H, 6.19%; N, 2.74%; 0, 2.07%; S, 12.50%; Se, 5.09%. Mass spectrum: calculated value: 1546.11; measured value: 1540.78.

Embodiment 3

Preparation of poly-6octyl-4-(5-(4,4,9,9-tetra(4-methoxyphenyl)-4,9-dihydro-s-benzobiindenodi[1,2-b:5,6-b']pyrid-2-yl)thien-2-yl)-8-(thien-2-yl)-5H-[1,2,5]selenadiazolo[3,4-f]isoindole-5,7(6H)-diketone, with a synthetic route and synthetic steps as follows:

Embodiment 4

Preparation of poly-4-(5-(5,10-dodecylnaphtho[1,2-B:5,6-B']dithien-2-yl)thien-2-yl)-6-octyl-8-(thien-2-yl)-5H-[1,2,5]selenadiazolo[3,4-f]isoindole-5,7(6H)-diketone, with a synthetic route and synthetic steps as follows:

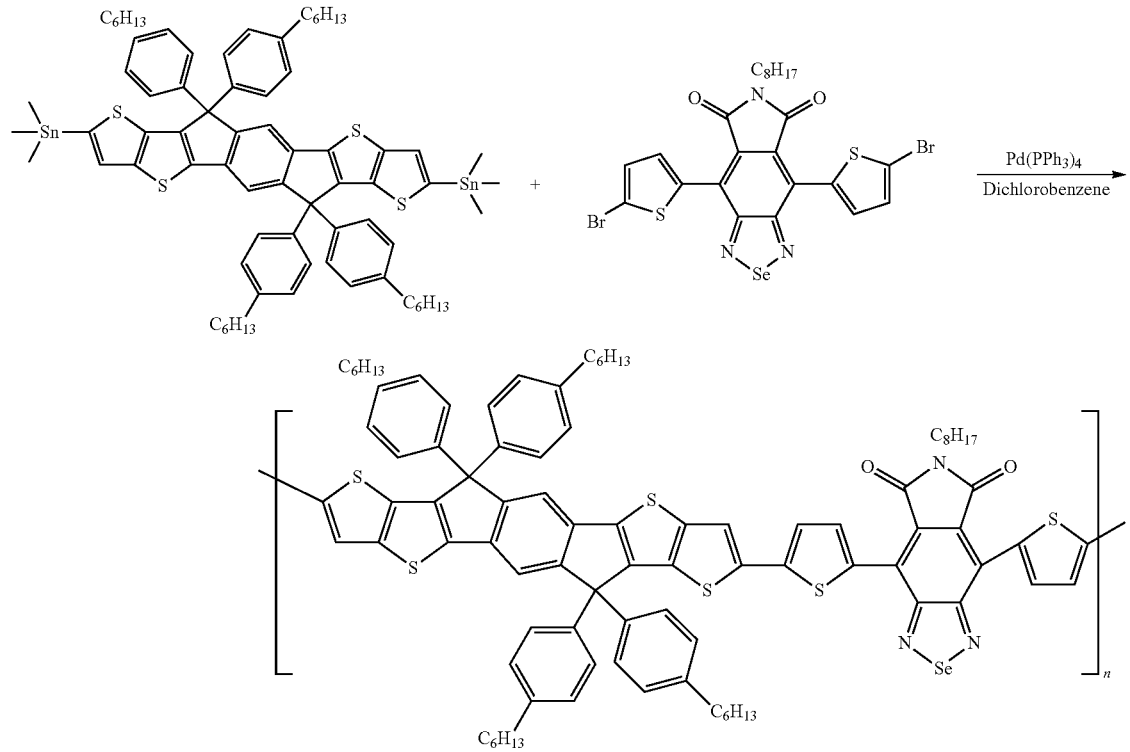

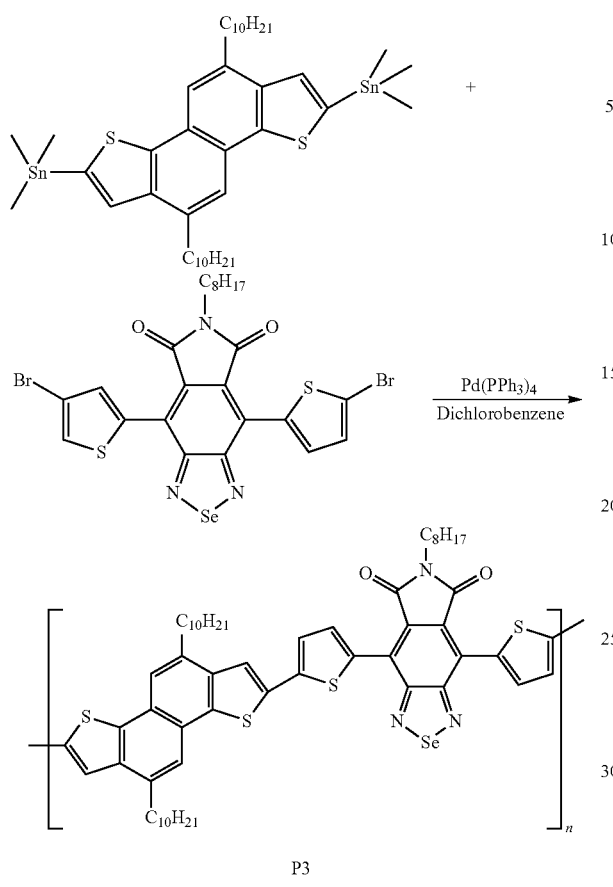

P3

4,8-bis(5-bromothien-2-yl)-6-octyl-5H-[1,2,5]selenadiazolo[3,4-f]isoindole-5,7(6H)-diketone (103 mg, 0.15 mmol), 5,10-didecanaphtho[1,2-B:5,6-b']bi-2,7-diyl-bis-trimethylstannane (127 mg, 0.15 mmol), tetra(triphenylphosphine)palladium (8 mg) and xylene (3 mL) were added into a 10 mL of microwave tube under argon, and then the reaction was carried out by microwave at 200° C. for 45 minutes. After the reaction was cooled to room temperature, the reaction liquid was precipitated in methanol. Soxhlet extraction was carried out with methanol, acetone and n-hexane successively, then an aqueous solution of sodium diethyldithiocarbamate trihydrate (225 mg, 1 mmol, 100 mL water) was added, and a stirring was carried out at 60° C. for 8 hours. Palladium catalyst was removed from the reaction. Soxhlet extraction was carried out with methanol, acetone and n-hexane. After drying, a dark green solid (137 mg) was obtained, with a yield: 85.09%. H-NMR: (CDCl$_3$) δ (ppm): 1H NMR (500 MHz, CDCl3) δ 7.91 (d, J=3.5 Hz, 2H), 7.53 (d, J=9.8 Hz, 2H), 7.21 (d, J=8.1 Hz, 2H), 7.12 (d, J=8.5 Hz, 2H), 4.80 (t, 2H), 2.58 (p, J=17.0 Hz, 2H), 1.79-1.58 (m, 6H), 1.47-1.13 (m, 38H), 0.87 (dd, J=7.8, 5.6 Hz, 9H). Elemental analysis: calculated value: C, 66.51%; H, 6.64%; N, 4.01%; O, 3.06%; S, 12.25%; Se, 7.54%; tested value: C, 66.57%; H, 6.66%; N, 4.00%; O, 3.03%; S, 12.22%; Se, 7.52%. Mass spectrum: calculated value: 1047.41; measured value: 1046.87.

Embodiment 6

Preparation of poly-4-(5-(4,8-bis(4-((2-ethylhexyl)oxy)-3-fluorophenyl)benzo[1,2-B:4,5-B']thien-2-yl)thien-2-yl)-6-octyl-8-(thien-2-yl)-5H-[1,2,5]selenadiazolo[3,4-f]isoindole-5,7(6H)-diketone, with a synthetic route and synthetic steps as follows:

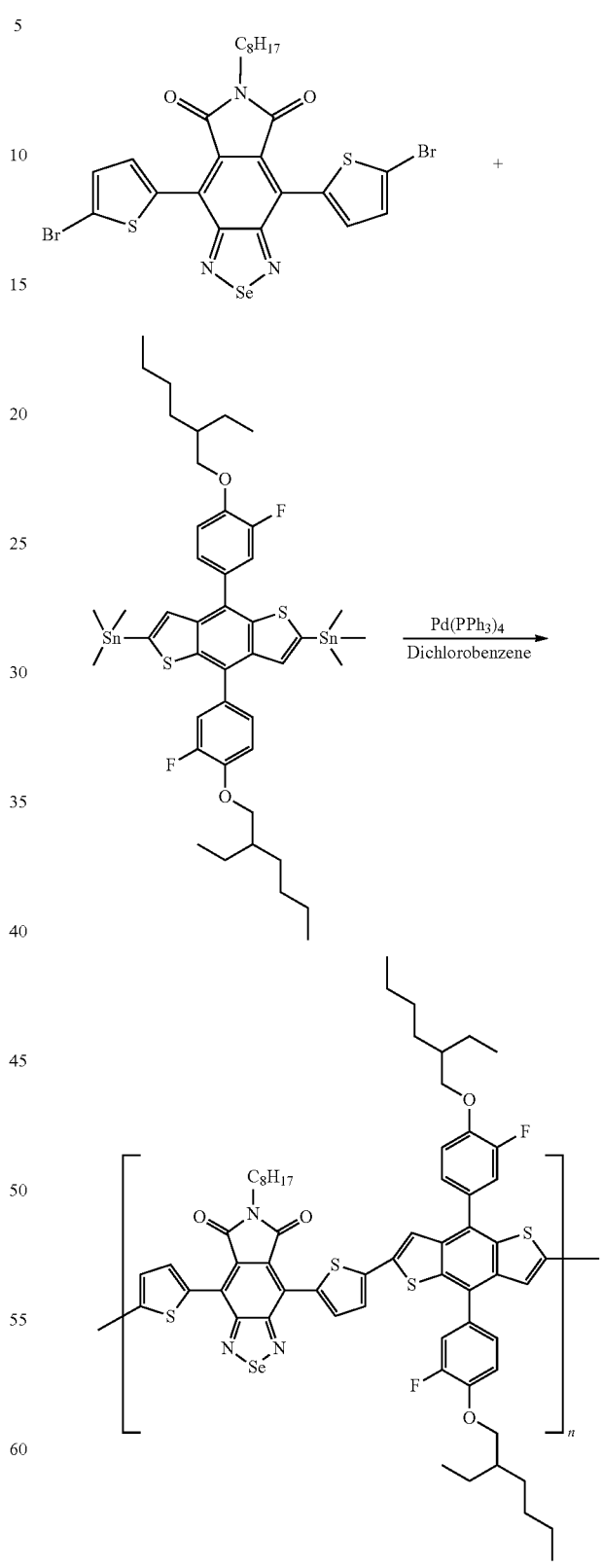

P4

4,8-bis(5-bromothien-2-yl)-6-octyl-5H-[1,2,5]selenadi-azolo[3,4-f]isoindole-5,7(6H)-dike tone (103 mg, 0.15 mmol), 4,8-bis(4-((2-ethylhexyl)oxy)-3-fluorophenyl)benzo[1,2-B: 4,5-B']thiophene-2,6-diyl-bis-(trimethylstannane) (144 mg, 0.15 mmol), tetra(triphenylphosphine)palladium (8 mg) and xylene (4 mL) were added into a 10 mL microwave tube under argon, and then the reaction was carried out by microwave at 200° C. for 45 minutes. After the reaction was cooled to room temperature, the reaction liquid was precipitated in methanol. Soxhlet extraction was carried out with methanol, acetone and n-hexane successively, then an aqueous solution of sodium diethyldithiocarbamate trihydrate (225 mg, 1 mmol, 100 mL water) was added, and a stirring was carried out at 60° C. for 8 hours. Palladium catalyst was removed from the reaction. Soxhlet extraction was carried out with methanol, acetone and n-hexane. After drying, a dark green solid (127 mg) was obtained, with a yield: 71.35%. H-NMR: (CDCl$_3$) δ (ppm): 7.95 (d, J=3.5 Hz, 2H), 7.50 (d, J=9.8 Hz, 2H), 7.24 (d, J=8.1 Hz, 4H), 7.12 (d, J=8.5 Hz, 4H), 4.89 (t, 6H), 2.52 (p, J=17.0 Hz, 4H), 1.71-1.51 (m, 6H), 1.42-1.11 (m, 26H), 0.88 (dd, J=7.8, 5.6 Hz, 15H). Elemental analysis: calculated value: C, 64.12%; H, 5.64%; F, 3.27%; N, 3.62%; 0, 5.51%; S, 11.04%; Se, 6.80%; tested value: C, 64.15%; H, 5.60%; F, 3.24%; N, 3.62%; 0, 5.55%; S, 11.08%; Se, 6.76%. Mass spectrum: calculated value: 1161.41; measured value: 1160.36.

Embodiment 7

Preparation of poly-4-(5-(4,8-bis(3-fluoro-4-((2-hexyldecan)oxy)phenyl)benzo[1,2-B:4,5-B']thien-2-yl)thien-2-yl)-6-octyl-8-(thien-2-yl)-5H-[1,2,5]selenadiazolo[3,4-f]isoindole-5,7(6H)-diketone, with a synthetic route and synthetic steps as follows:

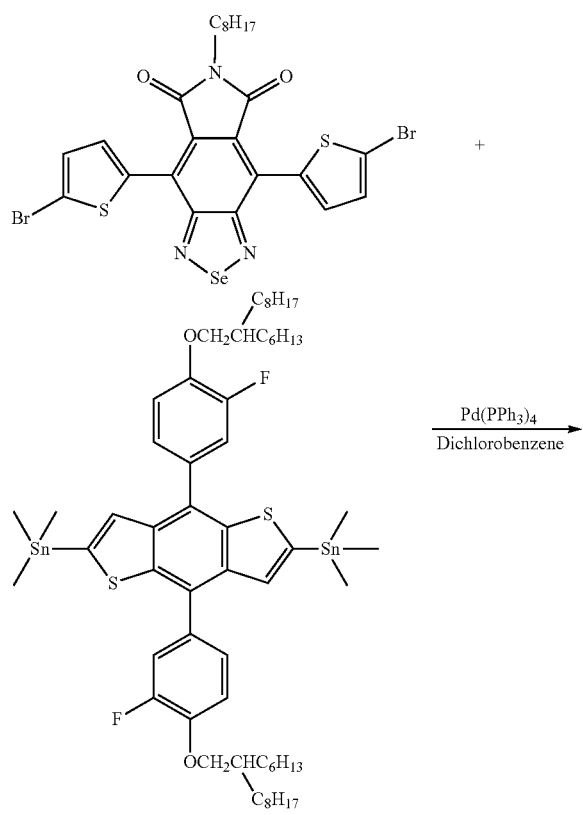

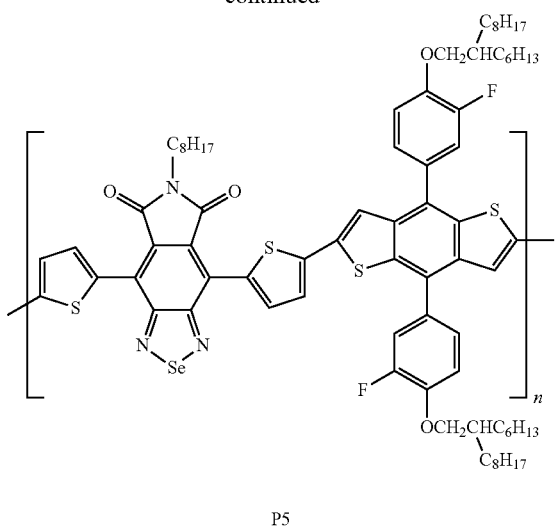

P5

4,8-bis(5-bromothien-2-yl)-6-octyl-5H-[1,2,5]selenadi-azolo[3,4-f]isoindole-5,7(6H)-dike tone (103 mg, 0.15 mmol), (4,8-bis(3-fluoro-4-((2-hexyldecan)oxy)phenyl)benzo[1,2-B:4,5-B']thiophene-2,6-diyl)bis(trimethylstannane) (178 mg, 0.15 mmol), tetra(triphenylphosphine)palladium (8 mg) and xylene (4 mL) were added into a 10 mL microwave tube under argon, and then the reaction was carried out by microwave at 200° C. for 45 minutes. After the reaction was cooled to room temperature, the reaction liquid was precipitated in methanol. Soxhlet extraction was carried out with methanol, acetone and n-hexane successively, then an aqueous solution of sodium diethyldithiocarbamate trihydrate (225 mg, 1 mmol, 100 mL water) was added, and a stirring was carried out at 60° C. for 8 hours. Palladium catalyst was removed from the reaction. Soxhlet extraction was carried out with methanol, acetone and n-hexane. After drying, a dark green solid (169 mg) was obtained, with a yield: 81.64%. H-NMR: (CDCl$_3$) δ (ppm): 7.97 (d, J=3.5 Hz, 2H), 7.56 (d, J=9.8 Hz, 2H), 7.23 (d, J=8.1 Hz, 4H), 7.18 (d, J=8.5 Hz, 4H), 4.81 (t, 6H), 1.75-1.53 (m, 6H), 1.46-1.13 (m, 58H), 0.87 (dd, J=7.8, 5.6 Hz, 15H). Elemental analysis: calculated value: C, 67.60%; H, 7.05%; F, 2.74%; N, 3.03%; 0, 4.62%; S, 9.26%; Se, 5.70%; tested value: C, 67.62%; H, 7.01%; F, 2.74%; N, 3.07%; 0, 4.63%; S, 9.26%; Se, 5.67%. Mass spectrum: calculated value: 1385.84; measured value: 1385.67.

Figure 2:
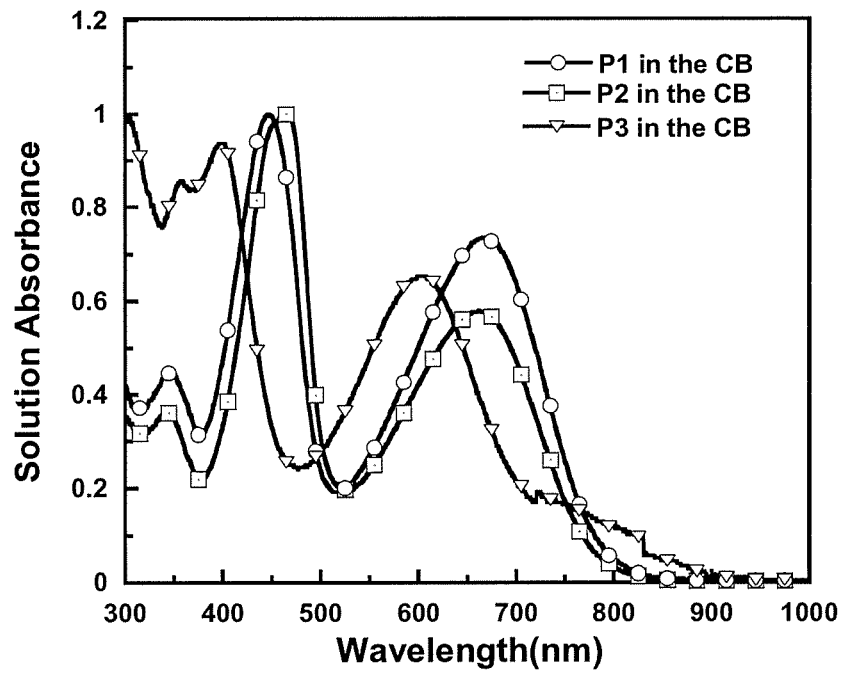
FIG. 2 is an absorption spectrum of the prepared polymer in a chlorobenzene solution.

Ultraviolet-visible absorption spectrums of the polymers prepared as described above are shown in FIG. 1 and FIG. 2. The ultraviolet-visible absorption spectrums are measured by Shimadzu UV-3600 ultraviolet analyzer. It can be seen from FIG. 1 and FIG. 2 that, polymers P1, P2 and P3 show strong absorptions at 400-500 nm and 600-800 nm. In particular, films made of the polymers P1, P2 and P3 show maximum absorption peaks at 465 nm, 447 nm and 414 nm. In chlorinated benzene, the maximum absorption peaks are shown at 457 nm, 438 nm and 406 nm. It indicates that the above-described polymers have a stronger absorption of sunlight. At the same time, it also indicates that the above-described polymers are prone to red-shift in the film due to the presence of selenium atom. Table 1 shows molecular orbital energy levels and optical band gaps of the above-described polymers.

TABLE 1

| Polymer | $E_{HOMO}$ (eV) | $E_{LUMO}$ (eV) | $E_g$ (eV) |
|---------|-----------------|-----------------|------------|
| P1 | −5.39 | −3.77 | 1.62 |
| P2 | −5.22 | −3.68 | 1.55 |
| P3 | −5.35 | −3.38 | 1.98 |
| P4 | −5.31 | −3.72 | 1.59 |
| P5 | −5.27 | −3.69 | 1.58 |

Figure 3:
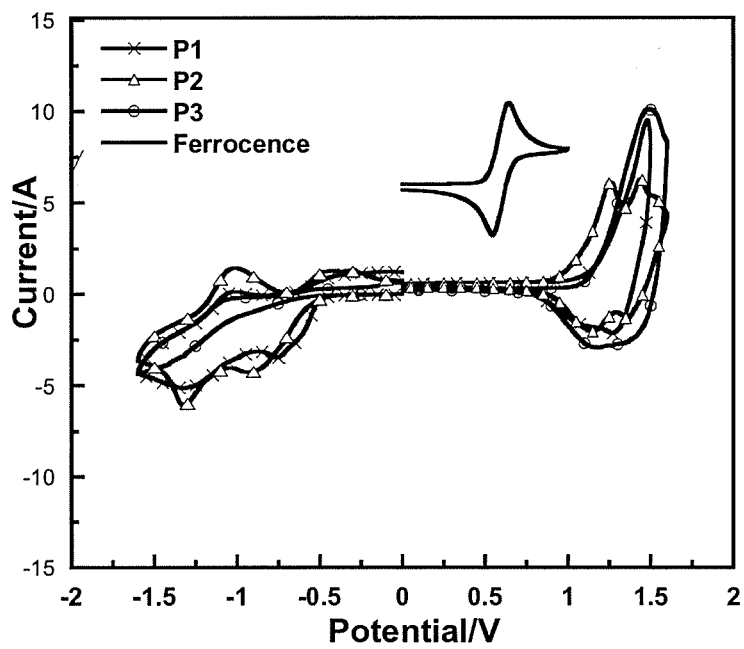
FIG. 3 and FIG. 4 are electrochemical curves of the prepared polymer.
Figure 4:
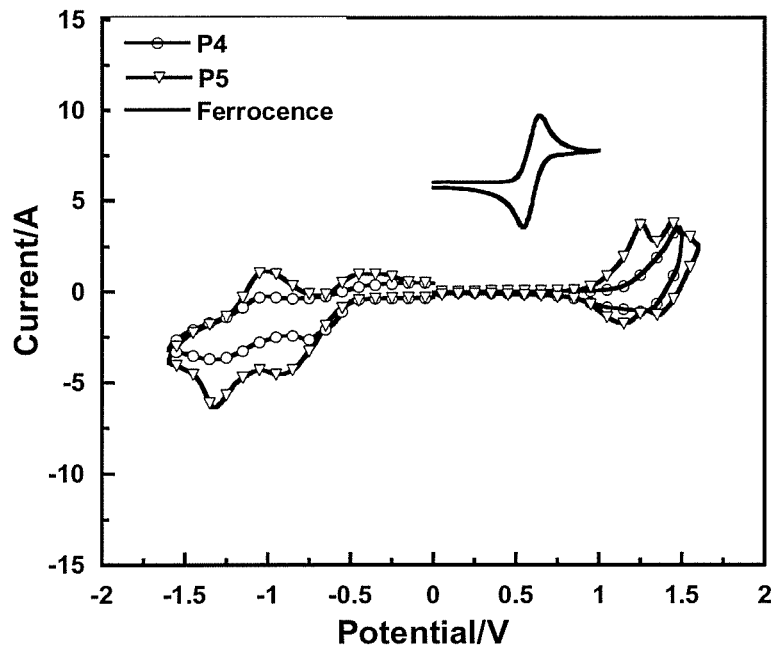

Electrochemical curves of the polymers prepared as described above are shown in FIG. 3 and FIG. 4. It can be seen that the above-described polymers have relatively deep HOMO energy levels (the HOMO energy level is the highest occupied molecular orbital, and the LUMO energy level is the lowest unoccupied molecular orbital). In particular, the polymers P1, P2, P3, P4 and P5 have relatively deep HOMO energy levels. Their optical band gaps are relatively narrow due to the presence of selenium atom, which are consistent with the data in the above table. Therefore, the conjugated polymer according to the present invention may be used for production of active layers of a polymer light-emitting diode device, a polymer field-effect transistor and a polymer solar cell.

The above-described embodiments are preferred implementations of the present invention, but the implementations of the present invention are not limited by any of the above-described embodiments. Other changes, modifications, substitutions, combinations, and simplifications that are made without departing from the spirit and principle of the present invention are all equivalent replacements, which shall be all included in the scope of protection of the present invention.

What is claimed:

1. A polymer containing 1,2,5-benzoselenadiazole-N—$R_1$-5,6-dicarboxylic acid imide, comprising a general structural formula as follows:

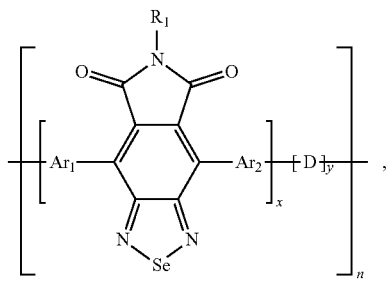

wherein $R_1$ is a hydrogen atom or an alkyl chain; said alkyl chain is a linear alkyl chain, a branched alkyl chain or a cyclic alkyl chain having 1 to 24 carbon atoms, or one or more of said carbon atoms of said alkyl chain of said $R_1$ are substituted by an oxygen atom, alkenyl, alkynyl, aryl, hydroxy, amino, carbonyl, carboxyl, ester, cyano, or nitro, and said hydrogen atom of said alkyl chain of said $R_1$ is substituted by an halogen atom or an oxygen atom, alkenyl, alkynyl, aryl, hydroxy, amino, carbonyl, carboxyl, ester, cyano, or nitro;
$Ar_1$ and $Ar_2$ are aromatic groups;
D is an electron-donating unit;
n is a natural number from 1 to 10000; and
$0<x<1$ and $0<y<1$, where x+y=1.

2. The polymer containing 1,2,5-benzoselenadiazole-N—$R_1$-5,6-dicarboxylic acid imide according to claim 1, wherein said $Ar_1$ and said $Ar_2$ are one or more of following structures:

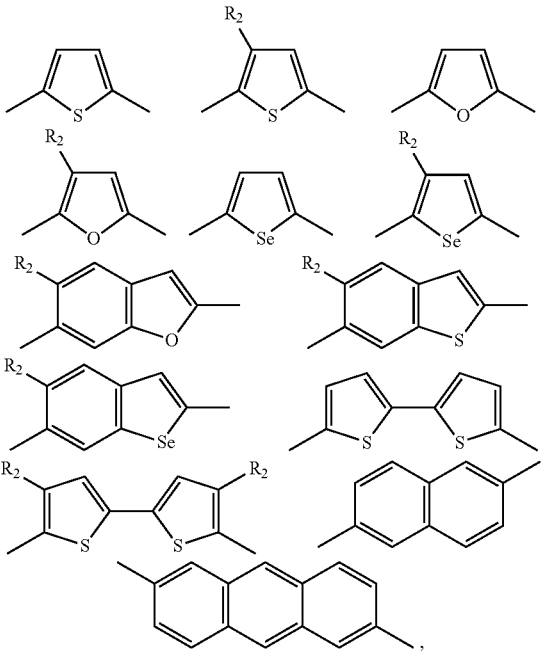

wherein $R_2$ is a hydrogen atom or an alkyl chain, or one or more of said carbon atoms of said alkyl chain of said $R_2$ are substituted by an oxygen atom, alkenyl, alkynyl, aryl, hydroxy, amino, carbonyl, carboxyl, nitro, phenyl or thienyl, or one or more of said hydrogen atoms of said alkyl chain of said $R_2$ are substituted by a halogen atom; and said D is one or more of following structures:

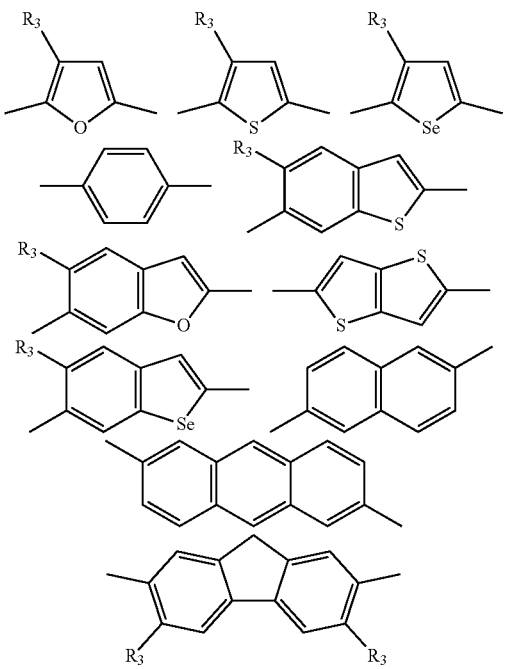

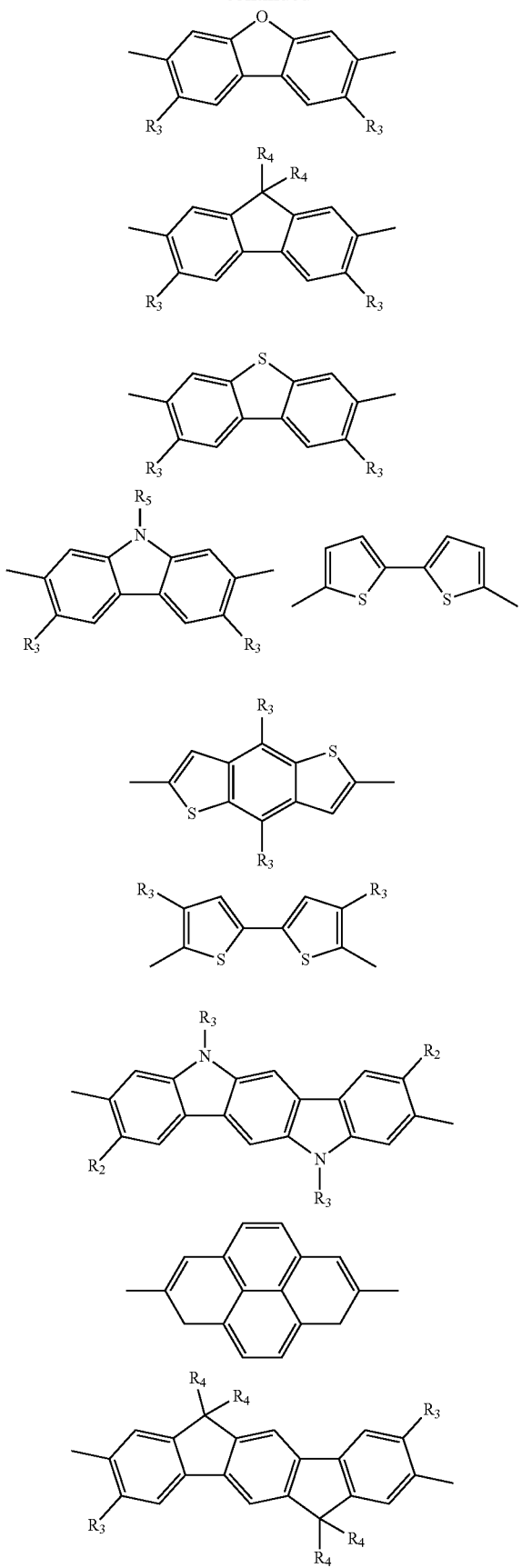
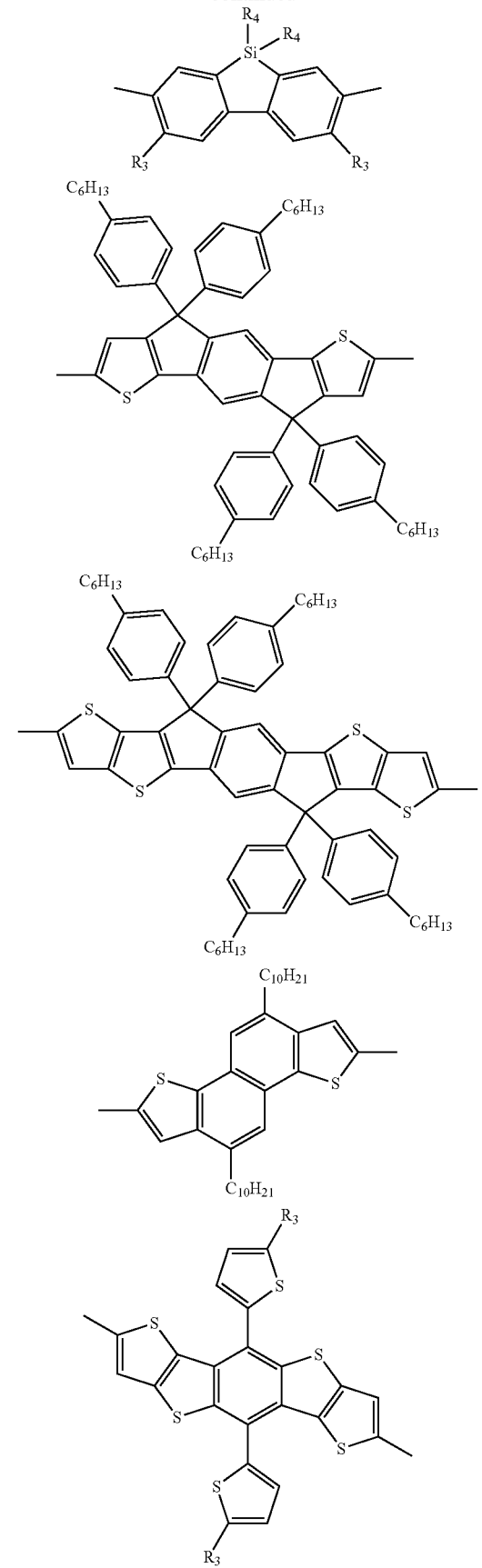

-continued

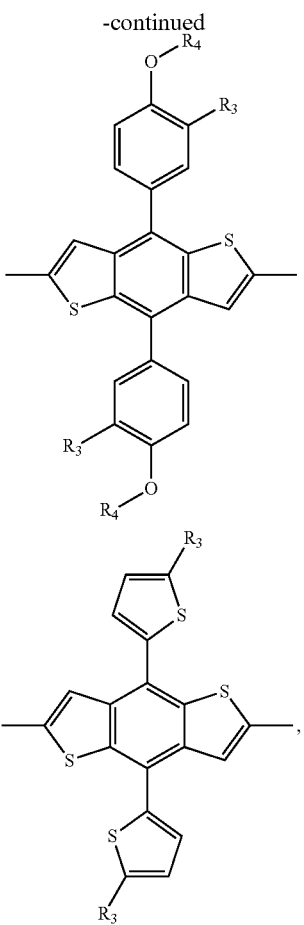

wherein $R_3$ and $R_4$ are hydrogen atoms or alkyl chains, or one or more of said carbon atoms of said alkyl chain of said $R_3$ or said $R_4$ are substituted by an oxygen atom, alkenyl, alkynyl, aryl, hydroxy, amino, carbonyl, carboxyl, nitro, phenyl or thienyl, or one or more of said hydrogen atoms of said alkyl chain of said $R_3$ or said $R_4$ are substituted by halogen atom.

3. The polymer containing 1,2,5-benzoselenadiazole-N—$R_1$-5,6-dicarboxylic acid imide according to claim 2, wherein said $R_2$, said $R_3$ and said $R_4$ are linear alkyl chains, branched alkyl chains or cyclic alkyl chains having 1 to 30 carbon atoms.

4. A method of preparing the polymer containing 1,2,5-benzoselenadiazole-N—$R_1$-5,6-dicarboxylic acid imide according to claim 1, comprising the following steps:
(1) using 2,5-dithieno-3,4-thiazole as a parent for reacting with dimethyl acetylenedicarboxylate to obtain 4,7-bis(thien-2-yl)benzo[c][1,2,5]thiadiazole-5,6-dimethyl isophthalate, obtaining 4,7-bis(thien-2-yl)benzo[c][1,2,5]thiadiazole-5,6-dicarboxylic acid by performing a hydrolyzation to said 4,7-bis(thien-2-yl)benzo[c][1,2,5]thiadiazole-5,6-dimethyl isophthalate, reacting said 4,7-bis(thien-2-yl)benzo[c][1,2,5]thiadiazole-5,6-dicarboxylic acid with acetic anhydride to obtain 4,8-bis(thien-2-yl)isobenzofuran[5,6-C][1,2,5]thiadiazole-5,7-diketone, reacting said 4,8-bis(thien-2-yl)isobenzofuran[5,6-C][1,2,5]thiadiazole-5,7-diketone with alkylamine to obtain 6-$R_1$-4,8-bis(thien-2-yl)-5H-[1,2,5]thiadiazolo[3,4-f]isoindole-5,7(6H)-diketone, obtaining 5,6-diamino-isoindole-1,3-diketone by performing a reduction to said 6-$R_1$-4,8-bis(thien-2-yl)-5H-[1,2,5]thiadiazolo[3,4-f]isoindole-5,7(6H)-diketone with an iron powder, reacting said 5,6-diamino-4,7-bis(thien-2-yl)-N—$R_1$-isoindole-1,3-diketone with selenium dioxide to obtain 4,7-bis(thien-2-yl)-1,2,5-benzoselenadiazole-N—$R_1$-5,6-dicarboxylic acid imide, and finally, obtaining a final monomer of 4,7-bis(5-bromo-thien-2-yl)-1,2,5-benzoselenadiazole-N—$R_1$-5,6-dicarboxylic acid imide by performing a bromination to said 4,7-bis(thien-2-yl)-1,2,5-benzoselenadiazole-N—$R_1$-5,6-dicarboxylic acid imide with NBS; and
(2) performing a metal-catalyzed cross-coupling reaction, wherein the metal-catalyzed cross-coupling reaction comprises reacting a monomer containing said D and having an active functional group for the metal-catalyzed cross-coupling reaction with said 4,7-bis(5-bromo-thien-2-yl)-1,2,5-benzoselenadiazole-N—$R_1$-5,6-dicarboxylic acid imide obtained in step (1) in a presence of a metal catalyst to obtain a conjugated polymer of a preliminary functional structure containing said D and said 4,7-bis(thien-2-yl)-1,2,5-benzoselenadiazole-N—$R_1$-5,6-dicarboxylic acid imide.

5. A luminescent layer of a polymer light-emitting diode device comprising the polymer containing 1,2,5-benzoselenadiazole-N—$R_1$-5,6-dicarboxylic acid imide according to claim 1.

6. A method of preparing the polymer containing 1,2,5-benzoselenadiazole-N—$R_1$-5,6-dicarboxylic acid imide according to claim 2, comprising the following steps:
(1) using 2,5-dithieno-3,4-thiazole as a parent for reacting with dimethyl acetylenedicarboxylate to obtain 4,7-bis(thien-2-yl)benzo[c][1,2,5]thiadiazole-5,6-dimethyl isophthalate, obtaining 4,7-bis(thien-2-yl)benzo[c][1,2,5]thiadiazole-5,6-dicarboxylic acid by performing a hydrolyzation to said 4,7-bis(thien-2-yl)benzo[c][1,2,5]thiadiazole-5,6-dimethyl isophthalate, reacting said 4,7-bis(thien-2-yl)benzo[c][1,2,5]thiadiazole-5,6-dicarboxylic acid with acetic anhydride to obtain 4,8-bis(thien-2-yl)isobenzofuran[5,6-C][1,2,5]thiadiazole-5,7-diketone, reacting said 4,8-bis(thien-2-yl)isobenzofuran[5,6-C][1,2,5]thiadiazole-5,7-diketone with alkylamine to obtain 6-$R_1$-4,8-bis(thien-2-yl)-5H-[1,2,5]thiadiazolo[3,4-f]isoindole-5,7(6H)-diketone, obtaining 5,6-diamino-4,7-bis(thien-2-yl)-N—$R_1$-isoindole-1,3-diketone by performing a reduction to said 6-$R_1$-4,8-bis(thien-2-yl)-5H-[1,2,5]thiadiazolo[3,4-f]isoindole-5,7(6H)-diketone with an iron powder, reacting said 5,6-diamino-4,7-bis(thien-2-yl)-N—$R_1$-isoindole-1,3-diketone with selenium dioxide to obtain 4,7-bis(thien-2-yl)-1,2,5-benzoselenadiazole-N—$R_1$-5,6-dicarboxylic acid imide, and obtaining a final monomer of 4,7-bis(5-bromo-thien-2-yl)-1,2,5-benzoselenadiazole-N—$R_1$-5,6-dicarboxylic acid imide by performing a bromination to said 4,7-bis(thien-2-yl)-1,2,5-benzoselenadiazole-N—$R_1$-5,6-dicarboxylic acid imide with NBS; and
(2) performing a metal-catalyzed cross-coupling reaction, wherein the metal-catalyzed cross-coupling reaction comprises reacting a monomer containing said D and having an active functional group for the metal-catalyzed cross-coupling reaction with said 4,7-bis(5-bromo-thien-2-yl)-1,2,5-benzoselenadiazole-N—$R_1$-5,6-dicarboxylic acid imide obtained in step (1) in a presence of a metal catalyst to obtain a conjugated polymer of a preliminary functional structure containing said D and said 4,7-bis(thien-2-yl)-1,2,5-benzoselenadiazole-N—$R_1$-5,6-dicarboxylic acid imide.

7. A method of preparing the polymer containing 1,2,5-benzoselenadiazole-N—$R_1$-5,6-dicarboxylic acid imide according to claim 3, comprising the following steps:

(1) using 2,5-dithieno-3,4-thiazole as a parent for reacting with dimethyl acetylenedicarboxylate to obtain 4,7-bis(thien-2-yl)benzo[c][1,2,5]thiadiazole-5,6-dimethyl isophthalate, obtaining 4,7-bis(thien-2-yl)benzo[c][1,2,5]thiadiazole-5,6-dicarboxylic acid by performing a hydrolyzation to said 4,7-bis(thien-2-yl)benzo[c][1,2,5]thiadiazole-5,6-dimethyl isophthalate, reacting said 4,7-bis(thien-2-yl)benzo[c][1,2,5]thiadiazole-5,6-dicarboxylic acid with acetic anhydride to obtain 4,8-bis(thien-2-yl)isobenzofuran[5,6-C][1,2,5]thiadiazole-5,7-diketone, reacting said 4,8-bis(thien-2-yl)isobenzofuran[5,6-C][1,2,5]thiadiazole-5,7-diketone with alkylamine to obtain 6-$R_1$-4,8-bis(thien-2-yl)-5H-[1,2,5]thiadiazolo[3,4-f]isoindole-5,7(6H)-diketone, obtaining 5,6-diamino-4,7-bis(thien-2-yl)-N—$R_1$-isoindole-1,3-diketone by performing a reduction to said 6-$R_1$-4,8-bis(thien-2-yl)-5H-[1,2,5]thiadiazolo[3,4-f]isoindole-5,7(6H)-diketone with an iron powder, reacting said 5,6-diamino-4,7-bis(thien-2-yl)-N—$R_1$-isoindole-1,3-diketone with selenium dioxide to obtain 4,7-bis(thien-2-yl)-1,2,5-benzoselenadiazole-N—$R_1$-5,6-dicarboxylic acid imide, and obtaining a final monomer of 4,7-bis(5-bromo-thien-2-yl)-1,2,5-benzoselenadiazole-N—$R_1$-5,6-dicarboxylic acid imide by performing a bromination to said 4,7-bis(thien-2-yl)-1,2,5-benzoselenadiazole-N—$R_1$-5,6-dicarboxylic acid imide with NBS; and (2) performing a metal-catalyzed cross-coupling reaction, wherein the metal-catalyzed cross-coupling reaction comprises reacting a monomer containing said D and having an active functional group for the metal-catalyzed cross-coupling reaction with said 4,7-bis(5-bromo-thien-2-yl)-1,2,5-benzoselenadiazole-N—$R_1$-5,6-dicarboxylic acid imide obtained in step (1) in a presence of a metal catalyst to obtain a conjugated polymer of a preliminary functional structure containing said D and said 4,7-bis(thien-2-yl)-1,2,5-benzoselenadiazole-N—$R_1$-5,6-dicarboxylic acid imide.

8. A semiconductor active layer in a polymer field-effect transistor comprising the polymer containing 1,2,5-benzoselenadiazole-N—$R_1$-5,6-dicarboxylic acid imide according to claim 1.

9. An active layer of a polymer solar photovoltaic cell comprising the polymer containing 1,2,5-benzoselenadiazole-N—$R_1$-5,6-dicarboxylic acid imide according to claim 1.

* * * * *